United States Patent
Peter (10) Patent No.: US 9,583,917 B2
(45) Date of Patent: Feb. 28, 2017

(54) MOUNTING UNIT AND METHOD FOR MOUNTING A MOUNTING RAIL TO A MOUNTING PLATE FOR A SWITCH CABINET

(71) Applicant: Krones AG, Neutraubling (DE)

(72) Inventor: Michael Peter, Thalmassing (DE)

(73) Assignee: Krones AG, Neutraubling (DE)

( * ) Notice: Subject to any disclaimer, the term of this patent is extended or adjusted under 35 U.S.C. 154(b) by 111 days.

(21) Appl. No.: 14/382,566

(22) PCT Filed: Feb. 20, 2013

(86) PCT No.: PCT/EP2013/053311
§ 371 (c)(1),
(2) Date: Sep. 3, 2014

(87) PCT Pub. No.: WO2013/135467
PCT Pub. Date: Sep. 19, 2013

(65) Prior Publication Data
US 2015/0076298 A1   Mar. 19, 2015

(30) Foreign Application Priority Data

Mar. 15, 2012  (DE) ........................ 10 2012 102 170

(51) Int. Cl.
| | | |
|---|---|---|
| *H02B 1/052* | (2006.01) | |
| *H05K 7/18* | (2006.01) | |
| *H01R 9/26* | (2006.01) | |
| *H02B 1/20* | (2006.01) | |
| *H02B 1/04* | (2006.01) | |
| *H01R 13/74* | (2006.01) | |

(52) U.S. Cl.
CPC ............. *H02B 1/052* (2013.01); *H05K 7/183* (2013.01); *H01R 9/2608* (2013.01); *H01R 13/741* (2013.01); *H02B 1/04* (2013.01); *H02B 1/205* (2013.01)

(58) Field of Classification Search
CPC .......... H02B 1/052; H02B 1/205; H02B 1/04; H01R 9/2608; H01R 13/741; H01R 9/26
USPC .................................................. 439/94, 532
See application file for complete search history.

(56) References Cited

FOREIGN PATENT DOCUMENTS

| | | | | |
|---|---|---|---|---|
| CH | EP 2551973 A1 * | 1/2013 | ................ | F16B 1/00 |
| DE | 9413971 U1 | 1/1996 | | |
| DE | 29606862 U1 | 6/1996 | | |
| DE | 29602505 U1 | 7/1996 | | |
| DE | 19608903 C1 | 10/1997 | | |
| DE | 69407384 T2 | 7/1998 | | |
| DE | 102004020310 A1 | 11/2005 | | |
| DE | 102004032864 A1 * | 2/2006 | ................ | H02B 1/42 |

(Continued)

OTHER PUBLICATIONS

German Search Report dated Oct. 31, 2012; DE app. No. 10 2012 102 170.8.

*Primary Examiner* — Abdullah Riyami
*Assistant Examiner* — Justin Kratt
(74) *Attorney, Agent, or Firm* — Walter | Haverfield LLP; D. Peter Hochberg; Sean F. Mellino (57) ABSTRACT

A mounting unit and a method are provided for mounting a mounting rail to a mounting plate for a switch cabinet. The mounting unit acts for mounting a mounting rail for electrical devices on a mounting plate for a switch cabinet and comprises a coupling element for coupling the mounting unit by a form closure with the mounting rail.

11 Claims, 5 Drawing Sheets

(56) References Cited

FOREIGN PATENT DOCUMENTS

| DE | 102005059306 B4 | 1/2011 | | |
|----|----|----|----|----|
| EP | 0 794 602 A2 | 9/1997 | | |
| EP | 0794602 A2 | 9/1997 | | |
| EP | 2369698 A1 | 9/2011 | | |
| FR | 2 571 183 A1 | 4/1986 | | |
| FR | 2571183 A1 | 4/1986 | | |
| FR | 2896922 A1 | 8/2007 | | |
| FR | EP 2369698 A1 * | 9/2011 | .............. | H02B 1/42 |
| WO | WO 00/62387 | 10/2000 | | |
| WO | WO 01/13482 A1 | 2/2001 | | |

\* cited by examiner

MOUNTING UNIT AND METHOD FOR MOUNTING A MOUNTING RAIL TO A MOUNTING PLATE FOR A SWITCH CABINET

CROSS-REFERENCE TO RELATED APPLICATIONS

This application is a National Stage application of International Application No. PCT/EP2013/053311, filed on Feb. 20, 2013, which claims priority of German patent application number 10 2012 102 170.8, filed on Mar. 15, 2012, both of which are incorporated herein by reference in their entireties.

BACKGROUND OF THE INVENTION

Field of the Invention

The invention relates to a mounting unit and a method for mounting a mounting rail to a mounting plate for a switch cabinet.

Description of the Prior Art

Conventionally, electrical devices placed in a switch cabinet are used for an electrical control of machines. The electrical devices in the switch cabinet are usually mounted on mounting rails like for example cap rails or C-rails. Herein, the electrical devices, in particular, terminal blocks, relays, contactors, etc., shall be clamped on the mounting rail, initially. Thereafter, the cap rails are mounted on a mounting plate of the switch cabinet.

DE 296 02 505 U1 discloses a cap rail as a part of a component part carrier system, wherein by means of the cap rail a stronger connection should be created between a cap rail and a mounting plate to be attached thereto.

For simplification and therewith the reduction in time of the mounting of a switch cabinet it is desirable to equip mounting rails entirely with electrical devices before the mounting rails are actually fastened to the mounting plate of the switch cabinet. Presently, however, according to the specific equipment of the mounting rails with electrical devices, some of the electrical devices have to be dismounted again so that the mounting rail can be screwed together with the mounting plate. Thereby, partially no preassembly of the terminals to the mounting rail is possible or many work steps are to be executed twice. Such a course of action increases on the one hand the mounting costs and on the other hand the space requirements for the electrical devices in the switch cabinet. Thus, the space requirements for the switch cabinet augment which increases in turn the costs for material and space.

SUMMARY OF THE PRESENT INVENTION

Therefore, it is the object of the present invention to provide a mounting unit and a method for mounting a mounting rail on a mounting plate for a switch cabinet with which the above-mentioned problems can be solved. In particular, a mounting unit and a method for mounting a mounting rail on a mounting plate for a switch board should be provided with which a simple and fast connection between the mounting rail and the mounting plate can be produced. For example, it shall not be necessary, to dismount electrical devices for fastening the mounting rail or to spare space for electrical devices.

This object is solved by a mounting unit for mounting a mounting rail for electrical devices on a mounting plate for a switch cabinet according to claim 1. The mounting unit comprises a coupling element for coupling the mounting unit by a form closure with the mounting rail.

By the mounting unit it is possible that a mounting rail, in particular a cap rail, C-rail, etc., is initially equipped at a workplace with electrical devices, in particular terminal blocks, relays, contactors, etc., and is then mountable to a mounting plate of a switch cabinet without dismounting the electrical devices. Thereby, decoupling of the mounting of the mounting rail on the mounting plate or in the switch cabinet from equipping the mounting rails is possible. This causes a shorter throughput time in the production of the switch cabinet.

Further, maximum use of the mounting rail and therewith also the space in the switch cabinet is possible by virtue of the mounting unit. The result is a reduction of the space requirements of the switch cabinet and therewith also the space requirements of a machine for the control of which the switch cabinet is needed. Thereby eventually arises a cost reduction for the switch cabinet, the machine and the required positioning space, as well.

Advantageous further developments of the mounting unit are given in the dependent claims.

The mounting unit preferably comprises a mounting unit opening for receiving a mounting plate fastening element for fastening the mounting unit to the mounting plate, wherein the coupling element is configured for couple the mounting unit to a mounting rail opening. Thereby, the equipped mounting rail can be mounted by means of the mounting unit to the mounting plate easily, without the need to dismount electrical devices beforehand.

Moreover, the mounting unit can further comprise a trough-shaped basic body which comprises a U-shaped recess for encompassing the mounting rail. Such a configuration of the mounting unit will be in particular advantageous, if the mounting rail is a cap rail, since a further form closure of the mounting unit with the mounting rail can be realized by the U-shaped recess.

Preferably, the coupling element comprises a snap element for forming a snap connection with a mounting rail opening, wherein the snap element s formed as two elements each formed like a flat spring and each connected at its one end with a basic body of the mounting unit and comprising at its other end a snap hook and wherein the two elements each formed like a flat spring are spaced from each other by a notch tapered from the snap hook to the basic body, wherein each of the snap hooks is positioned averted from the notch. Thereby, a very fast, simple and secure mounting of the equipped, and also of an unequipped, mounting rail on the mounting plate can be ensured by virtue of the mounting unit by snapping the mounting rail on the mounting plate without the need to dismount the electrical devices beforehand.

It is possible, that the mounting unit further comprises a bar from which a bolt protrudes, wherein the bolt is allocated to the coupling element. By virtue of the bolts of the mounting unit, mounting of the mounting rail on the mounting unit and therewith also on the mounting plate can be ensured to be even more secured against twisting.

It is advantageous, that the mounting unit comprises two coupling elements and/or two bars. The present implementation form can configure the mounting of the mounting rail on the mounting unit and therewith also on the mounting plate more secure against twisting.

In an advantageous manner, a first coupling element, a first bar with bolt, a second bar with bolt and a second coupling element are positioned adjacent to each other in the basic body, wherein the row is positioned transverse to the U-shaped recess. This implementation form serves likewise for increasing the security against twisting of the mount of the mounting rail on the mounting plate.

According to one version, the mounting unit opening can be positioned between the first bar with the bolt and the second bar with the bolt. Alternatively, the mounting unit can also comprise a first and a second mounting unit opening, and it is possible that the first mounting unit opening, the first coupling element, the first bar with the bolt, the second bar with the bolt, the second coupling element and the second mounting unit opening are positioned adjacent to each other in a row at the basic body.

It is possible that the mounting plate for a switch cabinet comprises at least one of the above-described mounting unit, wherein the mounting unit acts for mounting on a cap rail or a C-rail for electrical devices.

It is also possible, that a system for a switch cabinet comprises at least one of the above-described mounting plate, to which a mounting unit is mounted, and a mounting rail on which at least one electrical device and the mounting unit are mounted, wherein the mounting rail can be fastened by means of the mounting unit to the mounting plate.

The object is further solved by a method for mounting a mounting rail on a mounting plate for a switch cabinet according to claim 11. The method comprises the steps of: Equipping a mounting rail with at least one electrical device, fastening a mounting unit on the mounting plate by means of a mounting plate fastening element that is received in a mounting unit opening, and mounting the mounting unit on the mounting plate by coupling a coupling element by means of a form closure with the mounting rail, wherein the steps of equipping, fastening and mounting are executable in an arbitrary order.

It is advantageous that in the step of mounting the coupling element and a bolt protruding from a bar of the mounting unit are received in the mounting rail opening.

Further possible implementations of the invention comprise also combinations or features or styles described above or in the following with reference to the embodiments, even if they are not explicitly mentioned. Herein, the person skilled in the art will also add single aspects as improvements or additions to the respective basic form of the invention.

BRIEF DESCRIPTION OF THE DRAWINGS

In the following, the invention is described in more detail by means of embodiments and with reference to the appended drawing Figures, wherein.

In the figures, the same or functionally same elements are provided with the same reference signs unless given otherwise.

DETAILED DESCRIPTION OF THE PRESENT INVENTION

Figure 1:
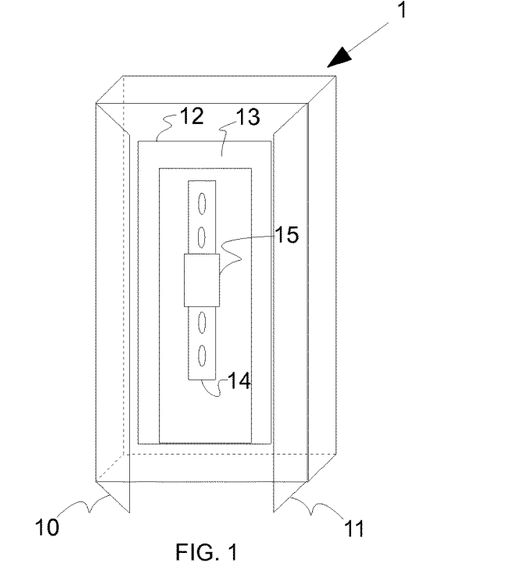
FIG. 1 shows a three-dimensional view of a switch cabinet in which a mounting rail is mounted by virtue of a mounting unit according to a first embodiment.

FIG. 1 shows a switch cabinet 1 with a left door 10, a right door 11, a mounting plate 12, a line conduit 13, and a mounting rail 14 on which electrical devices 15 are mounted, which are schematically shown. The mounting rail 14 can be, for example, a cap rail, a C-rail, etc. The electrical devices 15 comprise, for example, terminal blocks, circuit breakers, motor protection switches, relays, contactors, etc. The switch cabinet 1 can thus be a part of the electrical distribution of a building. The switch cabinet 1 can, however, also comprise electrical devices 15 which act, for example, for the control of a machine, in particular of a container treatment plant, which is not shown and which is for treating of containers for receiving a product, a grinding machine, a ventilation plant, an assembly line, etc.

Figure 2:
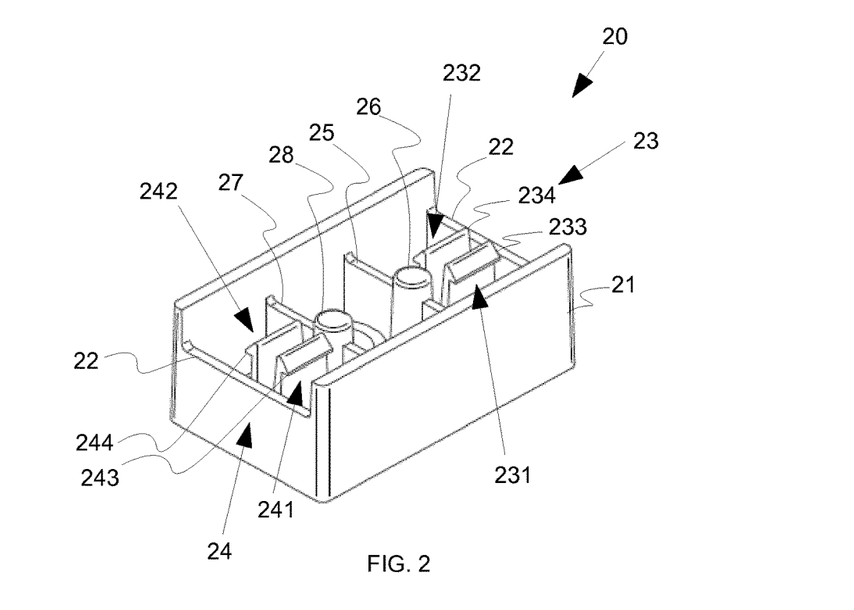
FIG. 2 shows a three-dimensional view of the mounting unit according to the first embodiment.

FIG. 2 shows a mounting unit 20 which is used in the switch cabinet 1 in FIG. 1 for mounting the mounting rail 14 on the mounting plate 12.

The mounting unit 20 has a trough-shaped housing 21 having two recesses 22 which are positioned at the front ends of the trough-shaped housing 21, respectively. In the trough-shaped housing 21 are positioned a first coupling element 23 and a second coupling element 24 as well as a first bar 25 with a bolt 26 protruding therefrom and a second bar 27 with a bolt 28 protruding therefrom. The first coupling element 23 has a first snap element 231 and a second snap element 232. The second coupling element 24 has a first snap element 241 and a second snap element 242. The snap elements 231, 232, 241, 242 are formed as an element each formed like a flat spring, which element comprises at its one end a snap hook 233, 234, 243, 244, respectively. The first bolt 26 protrudes from the first bar 25 in two directions. That means, the first bolt 26 is longer in the axis direction thereof than the first bar 25 has a height in this direction. In addition, the first bolt 26 has a larger diameter than the first bar 25 is thick in the direction of the diameter of the first bolt 26. The second bar 27 and the second bolt 28 are configured in the same way as the first bar 25 and the first bolt 26. Thus, the second bolt 28 protrudes from the second bar 27 in two directions. That means, the second bolt 28 is longer in the axis direction thereof than the second bar 27 has a height in this direction. Further, the second bolt 28 has a larger diameter than the second bar 27 is thick in the direction of the diameter of the second bolt 28.

Figure 3:
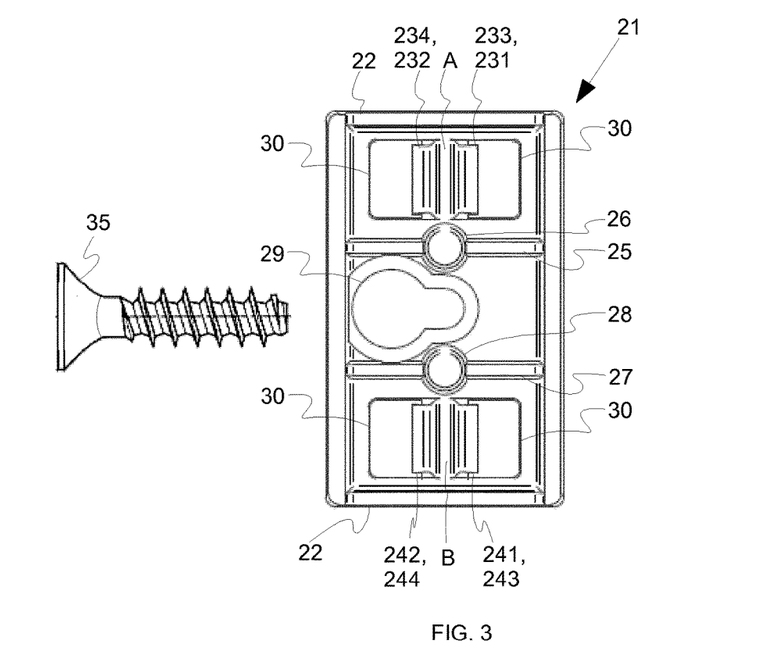
FIG. 3 shows a top view onto the mounting unit according to the first embodiment.

In FIG. 3 is shown in a top view onto the mounting unit 20, in addition to the housing 21, the recesses 22, the snap elements 231, 232, 241, 242 of the first and second coupling elements 23, 24, (FIG. 2), the first bar 25, the first bolt 26, the second bar 27, and the second bolt 28, also a first mounting unit opening 29 and four second mounting unit openings 30 as well as a first and second notch A, B. In the first mounting unit opening 29, a coupling element 35 like for example a screw, a clamp, a snap element, a blind rivet, etc. can be received such that the mounting unit 20 can be fastened to the mounting plate 12. The snap elements 231, 232, 241, 242 are positioned at the second mounting unit openings 30, respectively. The first notch A is positioned between the snap elements 231, 232. The second notch B is positioned between the snap elements 241, 242. The first and second notch A, B is also described in respect of FIG. 4 in more detail.

Figure 4:
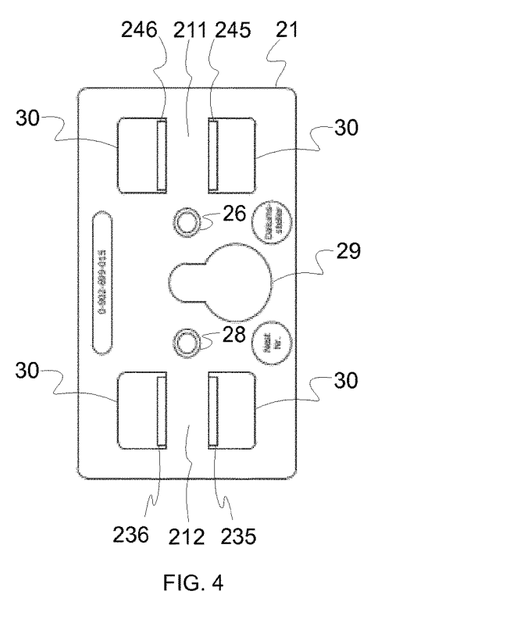
FIG. 4 shows a bottom view from beneath the mounting unit according to the first embodiment.

FIG. 4 shows a bottom view from beneath the mounting unit 20. Here, the other ends 235, 236, 245, 246 of the snap elements 231, 232, 241, 242 (FIG. 3) are depicted, respectively, which are fastened at the second mounting unit openings 30 to the basic body 21. As regards the first coupling element 23, the snap elements 231, 232 (FIG. 3) are spaced from each other by a spacing element 211 of the basic body 21, the spacing element 211 being formed like a bar. Due to this, the first and second snap elements 231, 232 (FIG. 3) of the first coupling element 23 are positioned adjacent to each other. Thus, the notch A (FIG. 3) is formed between the first and second snap elements 231, 232 or its elements each formed like a flat spring, wherein the notch A is formed tapered from the snap hooks 233, 234 (FIG. 2, FIG. 3) of the first coupling element 23 to the other ends 235, 236 of the first and second snap elements 231, 232. The snap hooks 233, 234 (FIG. 2, FIG. 3) are each positioned averted from the notch A (FIG. 3).

Additionally, as regards the second coupling element 24, the snap elements 241, 242 (FIG. 3) are spaced from each other by a spacing element 212 of the basic body 21, the spacing element 212 being formed like a bar. Due to this, the first and second snap elements 241, 242 (FIG. 3) of the second coupling element 24 are positioned adjacent to each other. Thus, the notch B (FIG. 3) is formed between the first and second snap elements 241, 242 or its elements each formed like a flat spring, wherein the notch B is formed tapered from the snap hooks 243, 244 (FIG. 2, FIG. 3) of the second coupling element 24 to the other ends 245, 246 of the first and second snap elements 241, 242. The snap hooks 243, 244 (FIG. 2, FIG. 3) are each positioned averted from the notch B (FIG. 3).

Figure 5:
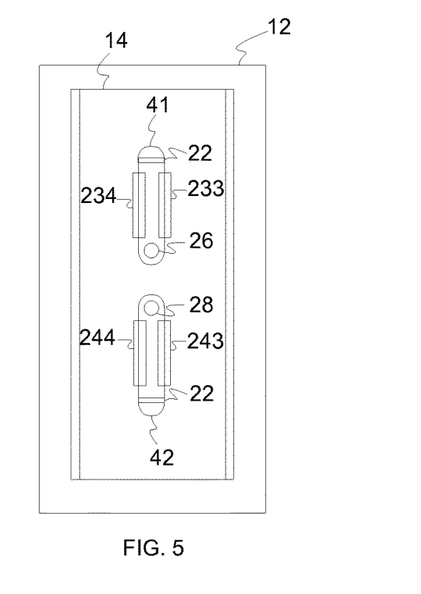
FIG. 5 shows a top view onto the mounting plate to which a mounting rail is mounted by virtue of the mounting unit according to the first embodiment.

FIG. 5 shows a top view onto a mounting rail 14 without electrical devices 15, wherein the mounting rail 14 is fastened by a mounting unit 20 to the mounting plate 12. The snap hooks 233, 234 are here passed through a first mounting rail opening 41 and get caught with the first mounting rail opening 41. Therewith, the coupling element 23 (FIG. 2) forms a form closure with the mounting rail 14. In addition, the first bolt 26 protrudes in the first mounting rail opening 41. Moreover, the snap hooks 243, 244 of the second snap element 24 are passed through a second mounting rail opening 42 and get caught with the second mounting rail opening 42. In this manner, the coupling element 24 (FIG. 2) forms a form closure with the mounting rail 14, too. In addition, the second bolt 28 protrudes in the second mounting rail opening 42. In the solution shown in FIG. 5, the basic body 21 is positioned at the recess 22 at, more specifically, beneath, the first mounting rail opening 41. Analogously, the other recess 22 of the basic body 21 is positioned beneath the second mounting rail opening 42. That means, the mounting unit 20 encompasses the mounting rail 14, as better seen from FIG. 6. Also this configuration contributes to the form closure between the mounting unit 20 and the mounting rail 14.

Figure 6:
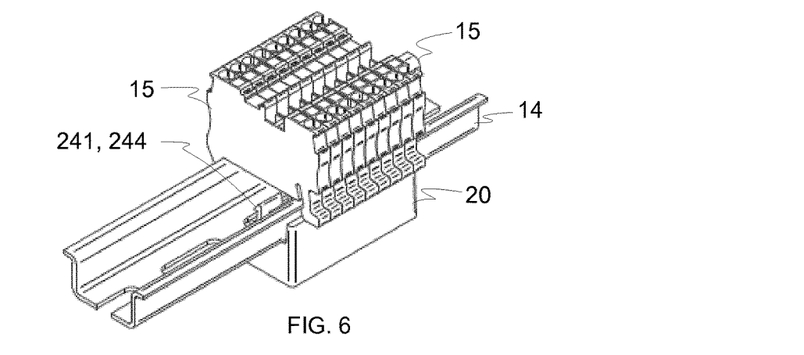
FIG. 6 shows a three-dimensional view of the mounting rail on which terminal blocks and the mounting unit according to the first embodiment are mounted.

FIG. 6 illustrates the mounting rail 14 equipped with several electrical devices 15 which are in this case terminal blocks 15. In FIG. 6 and the following figures, not all of the terminal blocks 15 are provided with a reference sign for the sake of clear arrangement. The mounting rail 14 is mounted on the mounting unit 20. It is depicted in FIG. 6 that the snap element 241 or its snap hook 244 forms a snap connection with the mounting rail 14, more specifically, with one of its mounting rail openings. The other snap elements 231, 232, 241 or its snap hooks 233, 234, 243 are not shown in FIG. 6. Because of the snap connection, it can also be said that the mounting rail 14 is snapped on the mounting unit 20.

Figure 7:
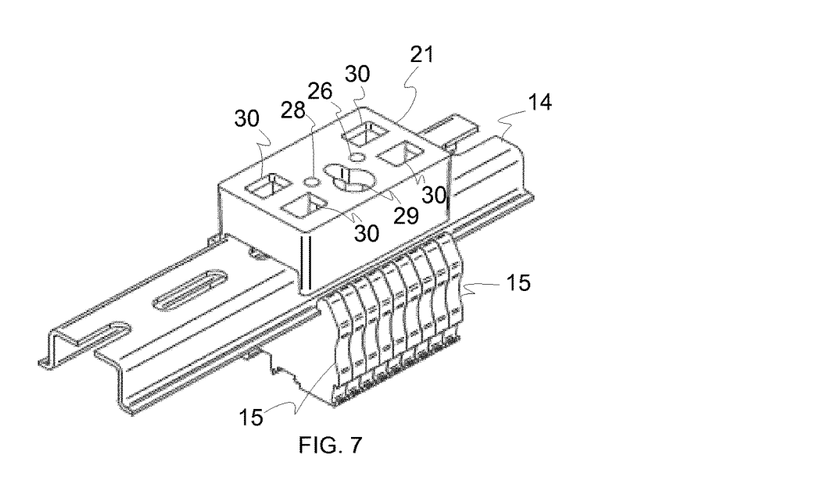
FIG. 7 shows a further three-dimensional view of the mounting rail on which the terminal blocks and the mounting unit according to the first embodiment are mounted.

FIG. 7 shows the arrangement of mounting rail 14, terminal blocks 15, and mounting unit 20 from FIG. 6 from beneath. In the stage shown in FIG. 7, there is still no mounting plate fastening element 35 (FIG. 3), with which the mounting unit 20 can be fastened to a mounting plate 12, set into the first mounting unit opening 29.

Figure 8:
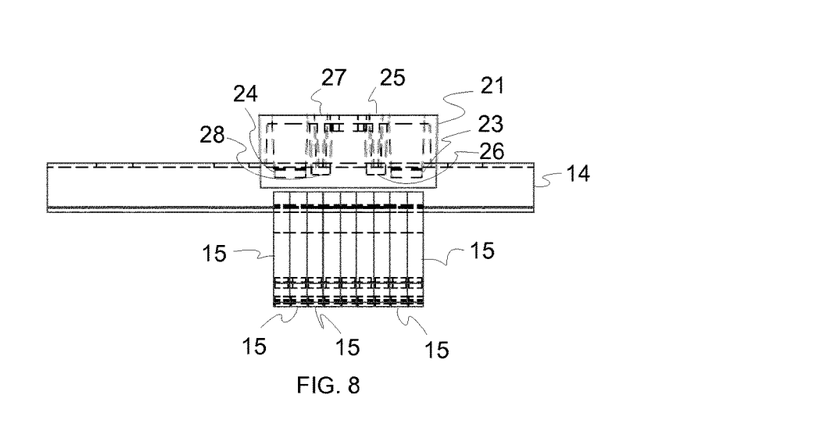
FIG. 8 shows a sectional view of the mounting rail on which the terminal blocks and the mounting unit according to the first embodiment are mounted.

FIG. 8 illustrates the arrangement and proportions of the first and second coupling elements 23, 24 compared to the first bolt 26 and the second bolt 28 in a sectional view. The first and second bolts 26, 28 are thus shorter than the coupling elements 23, 24, respectively. In this sectional view, there is further shown the proportion of the mounting unit 20 and the terminal blocks 15 and/or in respect to the mounting rail 14.

Figure 9:
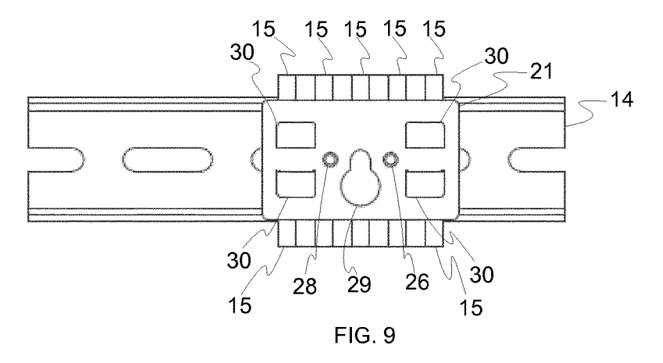
FIG. 9 shows a bottom view from beneath the mounting rail with terminal blocks and mounting unit of FIG. 8.

FIG. 9 shows a bottom view from beneath the arrangement of the terminal blocks 15 at the mounting rail 14, on which the mounting unit 20 is snapped, of FIG. 6. Here is also depicted, besides others, how the first mounting rail unit opening 29 of the mounting unit 20 is arranged relatively to the mounting rail 14 which is here a cap rail.

Figure 10:
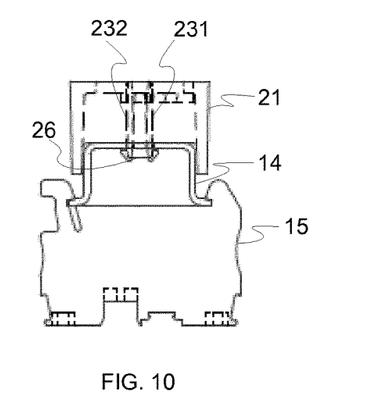
FIG. 10 shows a further sectional view of the mounting rail with terminal blocks and mounting unit of FIG. 8.

FIG. 10 shows a further sectional view in which is depicted in more detail, how the mounting unit 20 will encompasses the mounting rail 14, if the mounting 14 is a cap rail and if the snap elements 231, 232 of the coupling element 23 catch into the first mounting rail opening 41 and form a snap connection with the first mounting rail opening 41.

Figure 11:
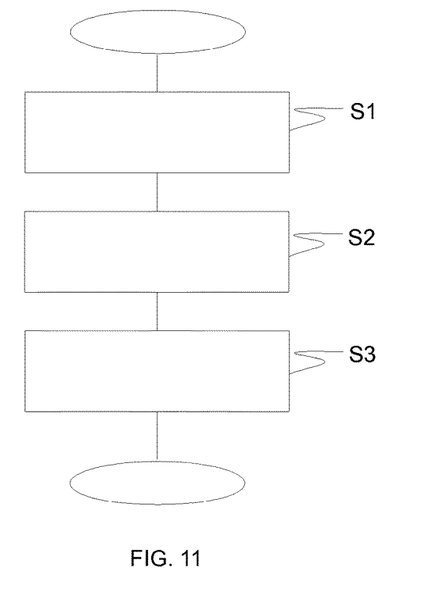
FIG. 11 shows a flow diagram of a method for mounting a mounting rail on a mounting plate for a switch cabinet according to the first embodiment.

A method for mounting a mounting rail 14 to a mounting plate 12 for a switch cabinet 1 is depicted schematically in FIG. 11. According thereto, the mounting rail 14 can be equipped in a step S1 with at least one electrical device 15. Independent therefrom, the mounting unit 20 can be fastened with the mounting plate fastening element 35 to the mounting plate 12 in a step S2. Herein, the mounting plate fastening element 35 is received at the first mounting unit opening 29. In case the step S1 and the step S2 are performed one after another and/or at least partly simultaneously or in case the step S2 is performed before the step S1 the mounting rail 14 can be fastened to the mounting unit 20 in a step S3. Herein, the first and/or the second coupling elements 23, 24 of the mounting unit 20 can engage into the mounting rail openings 41, 42. In the step S3, the first and second coupling elements 23, 24 and the first and second bolts 26, 28 can be received in the mounting rail openings 41, 42, as illustrated in FIG. 5. Thereafter, the method is finished.

The step S3 can, however, be executed before the step S1 or the step S2, as well. That means, the order of the steps S1 to S3 is arbitrary.

Figure 12:
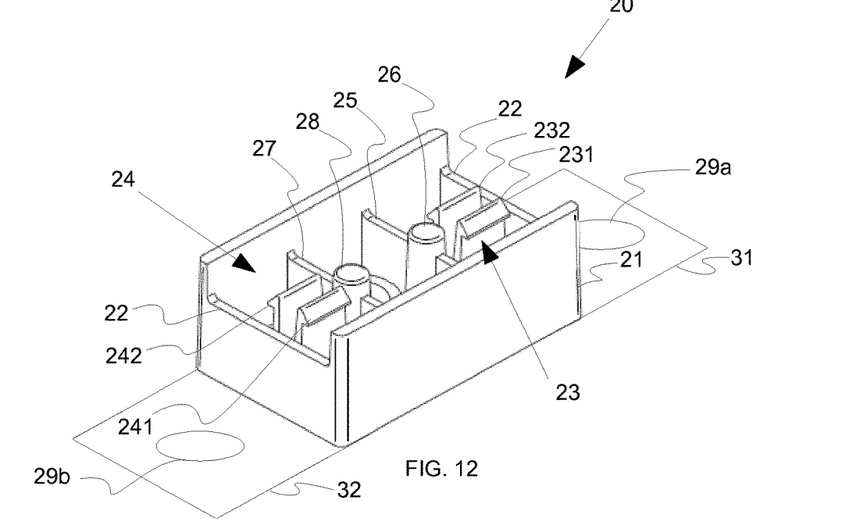
FIG. 12 shows a three-dimensional view of a mounting unit according to a second embodiment.

FIG. 12 shows a mounting unit 20 according to a second embodiment. The mounting unit 20 according to the present embodiment is configured in most parts in the same way like the mounting unit 20 of the first embodiment, so that only the differences between the first and the present embodiment are described in the following. In the present embodiment, the mounting unit 20 comprises two first mounting unit openings 29a, 29b instead of a first mounting unit opening 29 between the first bar 25 and the second bar 27. The both first mounting unit openings 29 are positioned at two mounting unit ears 31, 32 outside of the trough-shaped basic body 21. This is seen even better from the top view onto the mounting unit 20 in FIG. 13 and the bottom view beneath the mounting unit 20 in FIG. 14.

Figure 13:
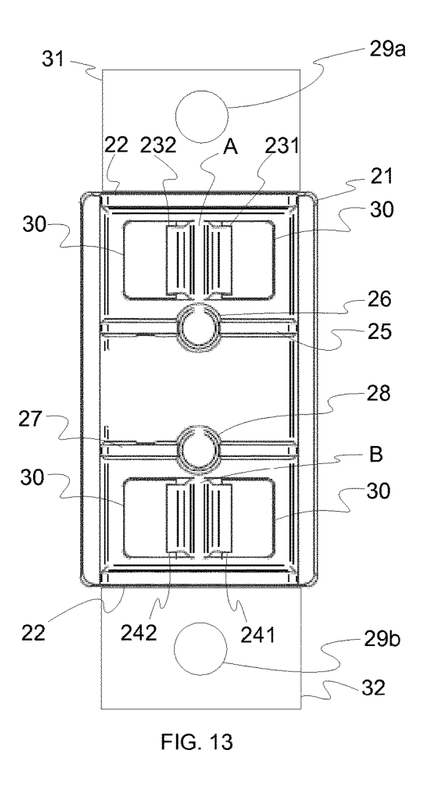
FIG. 13 shows a top view onto the mounting unit according to the second embodiment.
Figure 14:
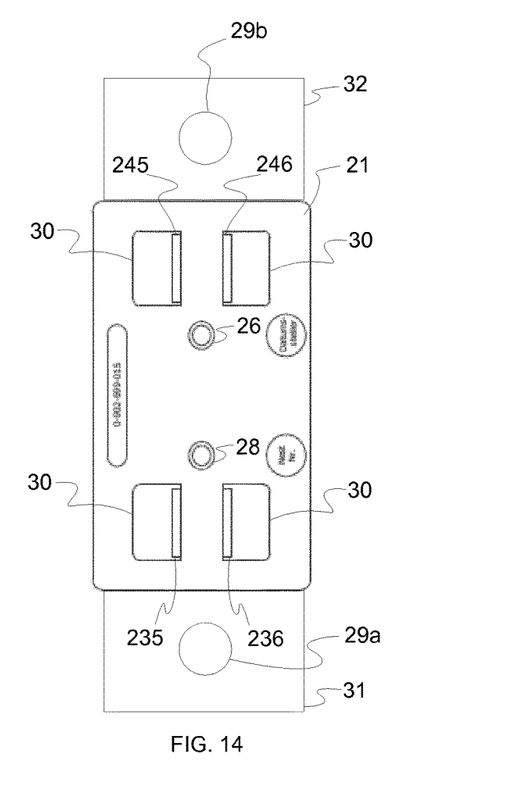
FIG. 14 shows a bottom view from beneath the mounting unit according to the second embodiment.

Thus, in FIG. 12 to FIG. 14, the first mounting unit opening 29a is positioned adjacent to the first coupling element 23, which is again positioned adjacent to the first bar 25 with the first bolt 26. The first bar 25 with the first bolt 26 is further positioned adjacent to the second bar 27 with the second bolt 28. The second bar 27 with the second bolt 28 is further positioned adjacent to the second coupling element 24 which is in turn positioned adjacent to the first mounting unit opening 29b.

All of the above-described implementations of the mounting unit and the method can be used separately or in all possible combinations thereof. The features of the first and second embodiments are combinable with each other arbitrarily. In addition, in particular, the following modifications are conceivable.

The elements shown in the figures are depicted schematically and can differ in the specific implementation from the forms shown in the figures provided that the above-described functions are ensured. In particular, the form and the size of the first and second mounting unit openings 29, 29a, 29b, 30 are selectable suitably. Further, in particular, the length of the bolts 26, 28 and the length of the coupling elements 23, 24 is selectable suitably. Moreover, in particular, the form and the size of the basic body 21 can be selected suitably.

The proportions of the depicted mounting unit 20 are arbitrary in so far, that a secure and as far as possible zero-play mount and/or mounting secure against twisting of the mounting rail 14 equipped with electrical devices 15 is possible on the mounting plate 12 of an electrical switch cabinet 1.

In particular, the coupling elements 23, 24 of the mounting unit 20 can be configured in another way than it is depicted in the figures. That means the coupling elements 23, 24 can comprise more or less snap hooks 233, 234, 243, 244 and/or snap hooks 233, 234, 243, 244 formed in another way, etc. In particular, it is not essential that the coupling elements 23, 24 comprise snap elements. The coupling elements 23, 24 can comprise clamps instead of the snap hooks 233, 234, 243, 244.

It is also possible, that the mounting unit 20 is coupled with a coupling element similar to the coupling element 23 and/or the coupling element 24 to the mounting plate 12.

The mounting unit 20 can comprise, in addition to the mounting unit opening 29 of the first embodiment, the mounting unit ears 31, 32 with the mounting unit openings 29a, 29b of the second embodiment. Each of the mounting unit ears 31, 32 can also comprise more than one mounting unit opening 29a, 29b.

Even if the mounting unit ears 31, 32 or the mounting unit openings 29a, 29b are positioned on the narrower sides of the mounting unit 20 in the second embodiment, the mounting unit ears 31, 32 or the mounting unit openings 29a, 29b can be positioned on the wide sides of the mounting unit 20, as well. The mounting unit ears 31, 32 or the mounting unit openings 29a, 29b can be positioned both on the narrow and the wide sides of the mounting unit 20, too.

The mounting unit 20 can be produced from an arbitrary suitable material, like for example plastic, metal, wood, etc. or from combinations thereof or from other suitable materials.

What has been described above are preferred aspects of the present invention. It is of course not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, combinations, modifications, and variations that fall within the spirit and scope of the appended claims.

What is claimed is:

1. A mounting unit for mounting a mounting rail for electrical devices on a mounting plate for a switch cabinet, the mounting unit comprising:
    a coupling element for coupling the mounting unit by a form closure with the mounting rail, the mounting rail comprising a mounting rail opening,
    wherein the coupling element is configured for coupling the mounting unit with the mounting rail opening,
    wherein the coupling element, for achieving the form closure with the mounting rail opening, is positioned on the mounting unit such that the coupling element, for coupling with the mounting rail opening, is catchable at one edge of the mounting rail opening to form the form closure,
    wherein the edge is oriented in the direction of the length of the mounting rail,
    wherein the coupling element comprises a snap element for forming a snap connection with said mounting rail opening,
    wherein the snap element is formed as two elements each formed like a flat spring and each connected at one end with a basic body of the mounting unit and comprising a snap hook at another end,
    wherein a notch spaces the two elements each formed like a flat spring from each other, said notch being tapered from the snap hook to the basic body, and
    wherein each of the snap hooks is positioned averted from the notch.

2. The mounting unit according to claim 1, further comprising a mounting unit opening for receiving a mounting plate fastening element for fastening the mounting unit to the mounting plate.

3. The mounting unit according to claim 1, further comprising a bar from which a bolt protrudes, wherein the bolt is allocated to the coupling element.

4. The mounting unit according to claim 1, further comprising a trough-shaped basic body in which the coupling element is positioned and which comprises a U-shaped recess for encompassing the mounting rail to contribute to the form closure between the mounting unit and the mounting rail.

5. The mounting unit according to claim 4, wherein the mounting unit comprises two coupling elements and/or two bars.

6. The mounting unit according to claim 5, wherein a first coupling element, a first bar with bolt, a second bar with bolt, and a second coupling element are positioned adjacent to each other in a row in the basic body, wherein the row is positioned transverse to the U-shaped recess of the basic body.

7. The mounting unit according to claim 6, further comprising a mounting unit opening for receiving a mounting plate fastening element for fastening the mounting unit to the mounting plate,
   wherein the mounting unit opening is positioned between the first bar with bolt and the second bar with bolt, or
   wherein the mounting unit comprises a first and a second mounting unit opening, and wherein the first mounting unit opening, the first coupling element, the first bar with the bolt, the second bar with the bolt, the second coupling element and the second mounting unit opening are positioned adjacent to each other in a row at the basic body.

8. A mounting plate for a switch cabinet comprising:
   at least one mounting unit for mounting a mounting rail for electrical devices on a mounting plate for a switch cabinet, the mounting unit comprising:
   a coupling element for coupling the mounting unit by a form closure with the mounting rail, the mounting rail comprising a mounting rail opening,
   wherein the coupling element is configured for coupling the mounting unit with the mounting rail opening,
   wherein the coupling element, for achieving the form closure with the mounting rail, is positioned on the mounting unit such that the coupling element, for coupling with the mounting rail opening, is catchable at one edge of the mounting rail opening to form the form closure,
   wherein the edge is oriented in the direction of the length of the mounting rail, and,
   wherein the mounting unit acts for a mount to a cap rail or a C-rail as the mounting rail for electrical devices,
   wherein the coupling element comprises a snap element for forming a snap connection with said mounting rail opening,
   wherein the snap element is formed as two elements each formed like a flat spring and each connected at one end with a basic body of the mounting unit and comprising a snap hook at another end,
   wherein a notch spaces the two elements each formed like a flat spring from each other, said notch being tapered from the snap hook to the basic body, and
   wherein each of the snap hooks is positioned averted from the notch.

9. A system for a switch cabinet, comprising:
   a mounting plate, to which at least one mounting unit for mounting a mounting rail for electrical devices on the mounting plate for a switch cabinet is mounted, wherein the mounting unit comprises a coupling element for coupling the mounting unit by a form closure with the mounting rail, the mounting rail comprising a mounting rail opening, wherein the coupling element is configured for coupling the mounting unit with the mounting rail opening, wherein the coupling element, for achieving the form closure with the mounting rail, is positioned on the mounting unit such that the coupling element, for coupling with the mounting rail opening, is catchable at one edge of the mounting rail opening to form the form closure, and wherein the edge is oriented in the direction of the length of the mounting rail, wherein the coupling element comprises a snap element for forming a snap connection with said mounting rail opening,
   wherein the snap element is formed as two elements each formed like a flat spring and each connected at one end with a basic body of the mounting unit and comprising a snap hook at another end,
   wherein a notch spaces the two elements each formed like a flat spring from each other, said notch being tapered from the snap hook to the basic body, and
wherein each of the snap hooks is positioned averted from the notch; and
   the mounting rail on which at least one electrical device and the mounting unit are mounted, wherein the mounting unit fastens the mounting rail to the mounting plate.

10. A method for mounting a mounting rail to a mounting plate for a switch cabinet, comprising the steps of:
   equipping a mounting rail with at least one electrical device, the mounting rail comprising a mounting rail opening;
   fastening a mounting unit on the mounting plate by a mounting plate fastening element that is received in a mounting unit opening; and
   mounting the mounting unit on the mounting plate by coupling a coupling element by a form closure with the mounting rail;
   wherein the coupling element is configured for coupling the mounting unit with the mounting rail opening,
   wherein the coupling element comprises a snap element for forming a snap connection with said mounting rail opening,
   wherein the snap element is formed as two elements each formed like a flat spring and each connected at one end with a basic body of the mounting unit and comprising a snap hook at another end,
   wherein a notch spaces the two elements each formed like a flat spring from each other, said notch being tapered from the snap hook to the basic body,
   wherein each of the snap hooks is positioned averted from the notch,
   wherein the coupling element, for achieving the form closure with the mounting rail, is positioned on the mounting unit such that the coupling element, for coupling with the mounting rail opening, is catchable at one edge of the mounting rail opening to form the form closure, and wherein the edge is oriented in the direction of the length of the mounting rail; and
   wherein the steps of equipping, fastening, and mounting are executable in an arbitrary order.

11. The method according to claim 10, wherein the step of mounting comprises receiving the coupling elements and a bolt, protruding from a bar of the mounting unit, in the mounting rail opening.

* * * * *